United States Patent

Wang et al.

(10) Patent No.: US 7,620,920 B2
(45) Date of Patent: Nov. 17, 2009

(54) TIME SEPARATED SIGNALS

(75) Inventors: Lei Wang, Fort Collins, CO (US); Randall J. Nettleton, Windsor, CO (US); Thomas J. Sullivan, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1059 days.

(21) Appl. No.: 11/089,580

(22) Filed: Jul. 2, 2004

(65) Prior Publication Data

US 2006/0005155 A1 Jan. 5, 2006

(51) Int. Cl.
*G06F 17/50* (2006.01)
*G06F 9/45* (2006.01)

(52) U.S. Cl. .............................................. 716/6; 716/4
(58) Field of Classification Search ..................... 716/6, 716/4
See application file for complete search history.

(56) References Cited

U.S. PATENT DOCUMENTS

| | | | | |
|---|---|---|---|---|
| 2003/0159118 | A1* | 8/2003 | Lindkvist | 716/5 |
| 2004/0098630 | A1* | 5/2004 | Masleid | 713/320 |
| 2004/0098684 | A1* | 5/2004 | Amekawa | 716/6 |
| 2005/0233573 | A1* | 10/2005 | Park | 438/618 |
| 2005/0246116 | A1* | 11/2005 | Foreman et al. | 702/69 |
| 2006/0192429 | A1* | 8/2006 | Broyde et al. | 307/4 |

* cited by examiner

*Primary Examiner*—Jack Chiang
*Assistant Examiner*—Suresh Memula

(57) ABSTRACT

Systems, methods, and other embodiments associated with time separated signals are described. One system embodiment includes a delay circuit, two or more sets of interconnects, and a clocked deracer circuit. In the system embodiment, at least one of the sets of interconnects is arranged as a shield for another set of interconnects. In the system embodiment, the delay circuit may select a timing delay to apply to the first signal to produce the near-end signal based, at least in part, on a desired ratio between a reduction in the slack associated with a setup time on a far-end receiver and a reduction in the slack associated with a hold time on a near-end receiver.

25 Claims, 6 Drawing Sheets

Prior Art Figure 3

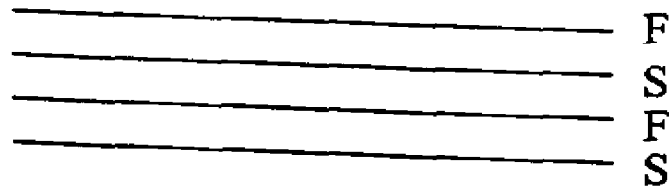
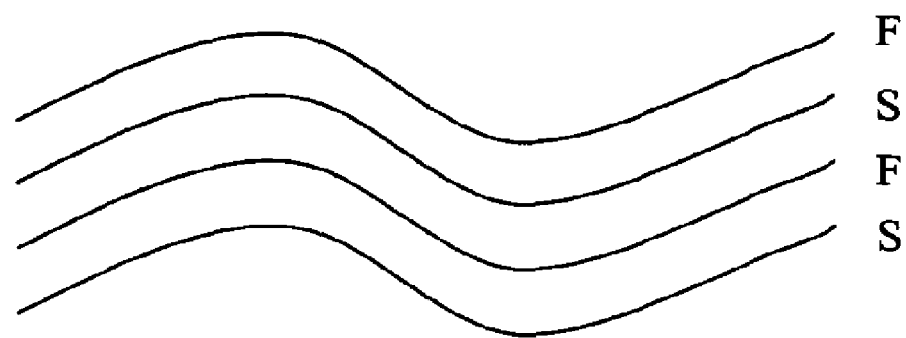
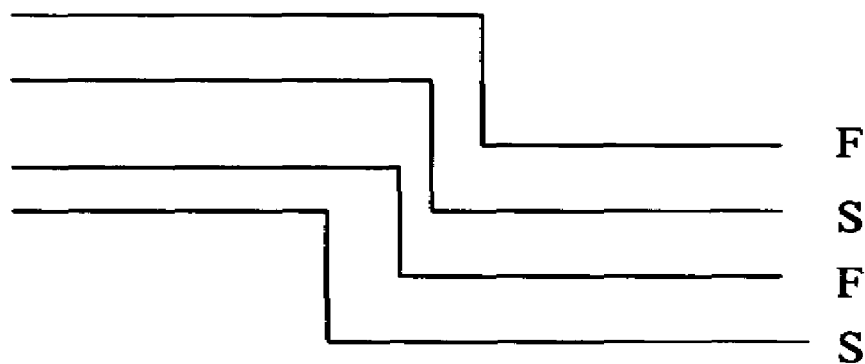
Figure 6

… (US 7,620,920 B2)

TIME SEPARATED SIGNALS

BACKGROUND

Continuing advances in semiconductor fabrication technology have lead to VLSI (very large scale integration) integrated circuit designs with greater numbers of faster components connected by increasing numbers of longer interconnects. These interconnects may be the source of design concerns like signal quality associated with induced signals, timing delays, and so on. As interconnects get longer and circuits become more complicated, clock skew may also grow as a design issue.

Timing delays and clock skew may be issues because circuits are clocked to facilitate keeping signals correlated in time. For example, for a flip flop to correctly capture data, the data provided to the flip flop must be stable for a period of time $T_{setup}$ before a relevant clock edge arrives. Similarly, for a flip flop to correctly latch data, the data provided to the flip flop must be stable for a period of time $T_{hold}$ after a relevant clock edge arrives. If a clocked network of circuit components has an unbalanced clock delay, then the relevant clock edge may arrive at different times at different circuit components leading to undesired and/or unanticipated results. Thus, the combination of clock skew, $T_{setup}$, and $T_{hold}$ requirements may complicate connecting circuit components via interconnects. While a flip flop is described as an example circuit component it is to be appreciated that timing delays and clock skew may affect other circuit components (e.g., clocked logics like latches) referred to more generally as receivers.

In one example, a microprocessor environment, interconnect lengths between and within microprocessor datapath blocks may produce performance bottlenecks. For example, interconnect capacitance per unit length, which may be dominated by sidewall fringing and coupling, may induce clock skews and delay variations. Setup time and hold time timing requirements for distributed receivers connected to such long, high-speed, on-chip interconnects may be more difficult to achieve due, for example, to shrinking cycle times and overlapping noise sources.

BRIEF DESCRIPTION OF THE DRAWINGS

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

Prior Art

FIG. 6 illustrates example interleaving patterns for interconnects.

DETAILED DESCRIPTION

Figure 1:
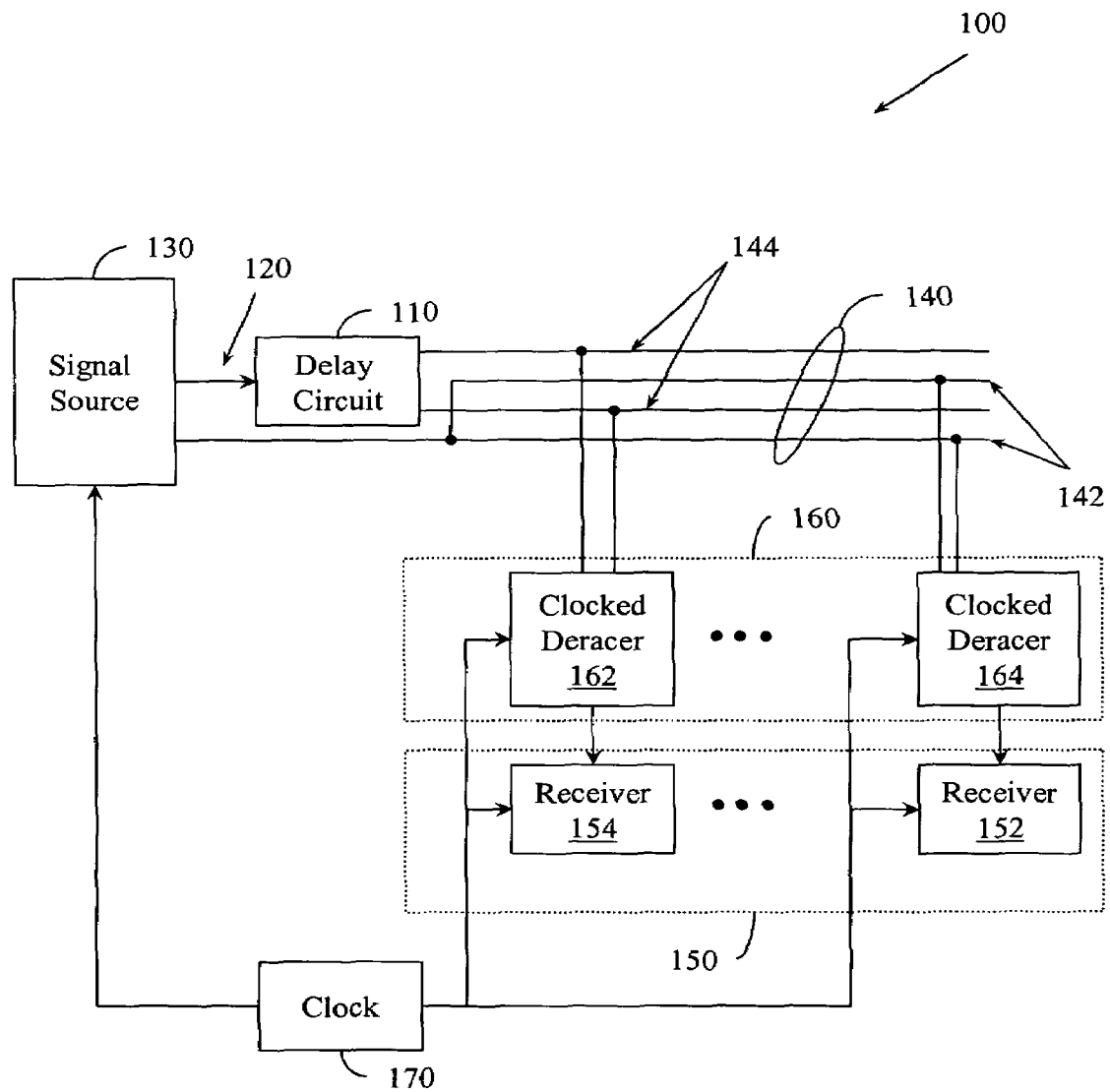
FIG. 1 illustrates an example system associated with processing time separated copies of a signal on interleaved interconnects.

Receivers distributed along on-chip interconnects may be located different distances, as measured by interconnect path length, from a signal provider. Near-end receivers (those closer to the signal provider) and far-end receivers (those farther from the signal provider) may experience different timing environments based on their proximity to the signal source. For example, near-end receivers may have a slack associated with their hold time. Similarly, far-end receivers may have a slack associated with their setup time and their hold time. The combination of these differing timing environments may complicate circuit design. The timing environment may be further complicated if interconnects are arranged in a manner that does not prevent complicating factors like induced signals and crosstalk induced delays. Thus, example systems and circuits include arranging interconnects as shields for other interconnects.

As described above, for a receiver (e.g., latch) to reliably catch an incoming signal, the signal needs to be stable for a period of time $T_{setup}$ before the rising edge of the clock. Similarly, the signal needs to hold its value steady for a certain period of time $T_{hold}$ after the rising edge of the clock. If the setup time requirement is not met, then a receiver may not evaluate the incoming signal correctly. If the hold time is not met, then the next cycle signal may race through the current signal. Using lengthy high-speed interconnects to distribute signals to both near-end and far-end receivers may compound combinations of hold time and setup time timing issues. Hold and/or setup timing failures may lead to undesired and/or unanticipated results. Therefore, to facilitate reliable operation, signals are constrained as to when during a clock cycle they may change their value. Rather than being able to change at any time during a clock cycle, signals may be constrained to change their value during a desired portion of a clock cycle. For high-speed interconnects with distributed on-chip receivers, effects like clock skew, resistor/capacitor delay (RC delay), crosstalk-induced delay, and so on may reduce the portion of the clock cycle during which the signal can change, increasing design burdens.

Thus, example systems and methods described herein concern addressing compounded setup time and hold time timing issues associated with integrated circuits configured with distributed receivers configured to receive signals via high-speed on-chip interconnects. Example systems and methods employ interleaved interconnects that carry time separated copies of a signal(s). The copies may be time separated, for example, by selectively introducing a delay into one copy of a signal without introducing the delay or while introducing a different delay into another copy of the signal. For example, in a configuration with two sets of interleaved interconnects, one set of interconnects may carry a slow copy of a signal and another set of interconnects may carry a fast copy of the same signal. The slow copy may be "slowed down", for example, by passing the signal through additional logic. For example, the signal may be passed through two inverters to introduce a two gate delay into the slow copy.

Near-end receivers may be configured to receive the slow copy of the signal while far-end receivers may be configured to receive the fast copy of the signal. Having the near-end receivers receive the slow copy of the signal facilitates removing slack associated with hold time. Similarly, having the far-end receivers receive the fast copy of the signal facilitates reducing slack associated with setup time to a desired range. Providing the far-end receivers with a fast copy may increase slack associated with the hold time at the far-end receivers, but this slack side effect can be controlled to within a similar desired range as that of the near-end receivers. By way of illustration, slack associated with hold time at both near-end and far-end receivers may be removed by clocked deracers. The signals (e.g., fast copy and slow copy) may pass through the clocked deracers before being provided to the receivers. While two signals are described, a fast copy and a slow copy, it is to be appreciated that in some examples three or more signals (e.g., slow, intermediate(s), fast) may be employed.

As mentioned above, continuing advances in semiconductor fabrication technology have led to VLSI integrated circuits having more components connected by increasing numbers of longer interconnects. Thus, chip density and wire density continue to be an ongoing concern. Therefore, example systems and methods may facilitate mitigating compound setup/hold time issues without increasing wire density by, for example, replacing shielding power lines with shielding data lines. By way of illustration, interconnects carrying the fast copy of the signal may be interleaved with interconnects carrying the slow copy of the signal so that the interconnects act as shields for each other. The shielding effect may be achieved, for example, by consuming chip area in which other interconnects that may induce signals or produce crosstalk induced delays might have resided, by producing fields that prevent signals from being induced, and so on.

Conventional VLSI chip designs may route interconnects between shielding lines (e.g., $V_{DD}$, ground) to mitigate crosstalk-induced delay and the like. Example systems and methods may instead interleave interconnects in patterns that facilitate self-shielding in lieu of using shielding power lines. For example, two conventional power lines that provide shielding while not carrying a data signal may be replaced with interleaved interconnects carrying different copies of a data signal. By interleaving the interconnects, the interconnects are geographically separated from other interconnects that may induce signals or delays without consuming additional chip area. Thus, timing problems may be mitigated without increasing wire density.

The following includes definitions of selected terms employed herein. The definitions include various examples and/or forms of components that fall within the scope of a term and that may be used for implementation. The examples are not intended to be limiting. Both singular and plural forms of terms may be within the definitions.

A "clocked deracer" is a circuit configured to use a receiving latch pulse clock to briefly block incoming signals while the receiving latch is open. Doing so effectively reduces or removes slack associated with hold time. A clocked deracer may adapt its delay to receiver pulse width distortion by remaining opaque longer.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, an application specific integrated circuit (ASIC), a programmed logic device, a memory device containing instructions, or the like. Logic may include one or more gates, combinations of gates, or other circuit components. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. Typically, an operable connection includes a physical interface, an electrical interface, and/or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical and/or physical communication channels can be used to create an operable connection.

FIG. 1 illustrates an example system 100. The system 100 may be configured to process time separated copies of a signal 120. The time separated copies may be transmitted, for example, via interleaved interconnects 140. System 100 may include a delay circuit 110 that is configured to receive a first signal 120 from, for example, a signal source 130. The signal source 130 may be, for example, a driver, a combinational circuit, a combinational circuit component, a sequential circuit, a sequential circuit component, and so on. The delay circuit 110 may be configured to provide a time separated copy of the first signal 120. In one example, the delay circuit 110 may be formed from a set of inverters, for example, two inverters. Thus, the time separated copy of the first signal 120 may be produced by passing the first signal 120 through the two inverters to produce a two gate delay.

System 100 may, for example, be fabricated into a VLSI integrated circuit. The VLSI integrated circuit may include, for example, a datapath circuit from which the first signal 120 is received and/or a datapath circuit to which the first signal 120 and/or the time separated copy of the first signal 120 are provided. While a datapath circuit is described, it is to be appreciated that signals may be received from various sources in an integrated circuit and distributed to various receivers in the integrated circuit.

System 100 may also include interconnects 140 that are configured to deliver either the original signal 120 or a time-separated copy of the original signal to various receivers 150. The interconnects 140 may include two or more sets of interconnects. For example, interconnects 140 may include a first set of interconnects 142 that are configured to deliver the original signal 120 to a first set of receivers 152 and a second set of interconnects 144 that are configured to deliver a time-separated copy of the original signal to a second set of receivers 154. In one example, at least one of the sets of interconnects is operably connected to the delay circuit 110. For example, in FIG. 1, the second set of interconnects 144 is operably connected to the delay circuit 110. In FIG. 1, the first set of interconnects 142 is illustrated not being connected to the delay circuit 110. Those skilled in the art will appreciate that the first set of interconnects 142 may be connected to the delay circuit 110, which may be configured to pass the original signal 120 through to the first set of interconnects 142 without introducing a timing delay. In another example, the delay circuit 110 may be configured to produce a first time delay on a first signal provided to the first set of interconnects 142 while producing a second time delay on a second signal provided to the second set of interconnects 144.

In system 100, the first set of interconnects 142 may be arranged on an integrated circuit as a shield to facilitate shielding the second set of interconnects 144. For example, the first set of interconnects 142 may be arranged on the integrated circuit as a shield to facilitate shielding the second set of interconnects 144 from experiencing an undesired signal being induced thereon. Similarly, the second set of interconnects 144 may be arranged on the integrated circuit as a shield for the first set of interconnects 142 to facilitate shielding the first set of interconnects 142 from having an undesired signal induced thereon. Additionally, and/or alternatively, the first set of interconnects 142 may shield the second set of interconnects 144 from experiencing a crosstalk-induced delay and/or the second set of interconnects 144 may shield the first set of interconnects 142 from experiencing a crosstalk-induced delay. In one example, the shielding may be geographic in that the interleaving prevents other interconnects from being routed near the interconnects and thus inducing signals. In another example, the shielding may be electrical in that neighboring interconnects may produce fields that facilitate preventing induced signals and/or delays.

System 100 may include a set 160 of clocked deracer circuits. Members (e.g., 162, 164) of the set 160 may be operably connected to at least one interconnect and may be configured to delay delivery of a signal carried by that interconnect to a member of the set 150 of receivers. The set 160 of clocked deracers may have available a clock signal from a clock 170. A receiver may be, for example, a clock controlled circuit component like an inverter and a latch, and the like.

With a "fast" and a "slow" copy of a signal available to receivers, and with interleaved sets of interconnects available to deliver the fast and slow copies, system 100 may facilitate mitigating hold and setup time problems associated with delivering signals via lengthy high-speed interconnects. Thus, in one example, the first set of interconnects 142 may be configured to provide a set of far-end receivers with a far-end signal configured to remove a slack associated with a setup time on the set of far-end receivers. Similarly, the second set of interconnects 144 may be configured to provide a set of near-end receivers with a near-end signal configured to reduce a slack associated with a hold time on the set of near-end receivers. To facilitate application in a variety of on-chip environments, delay circuit 110 may, in one example, be configurable to select a timing delay to apply to the first signal 120 to produce the near-end signal based, at least in part, on a desired ratio between a reduction in a slack associated with a setup time on the far-end receivers and a reduction in a slack associated with a hold time on the near-end receivers.

Figure 2:
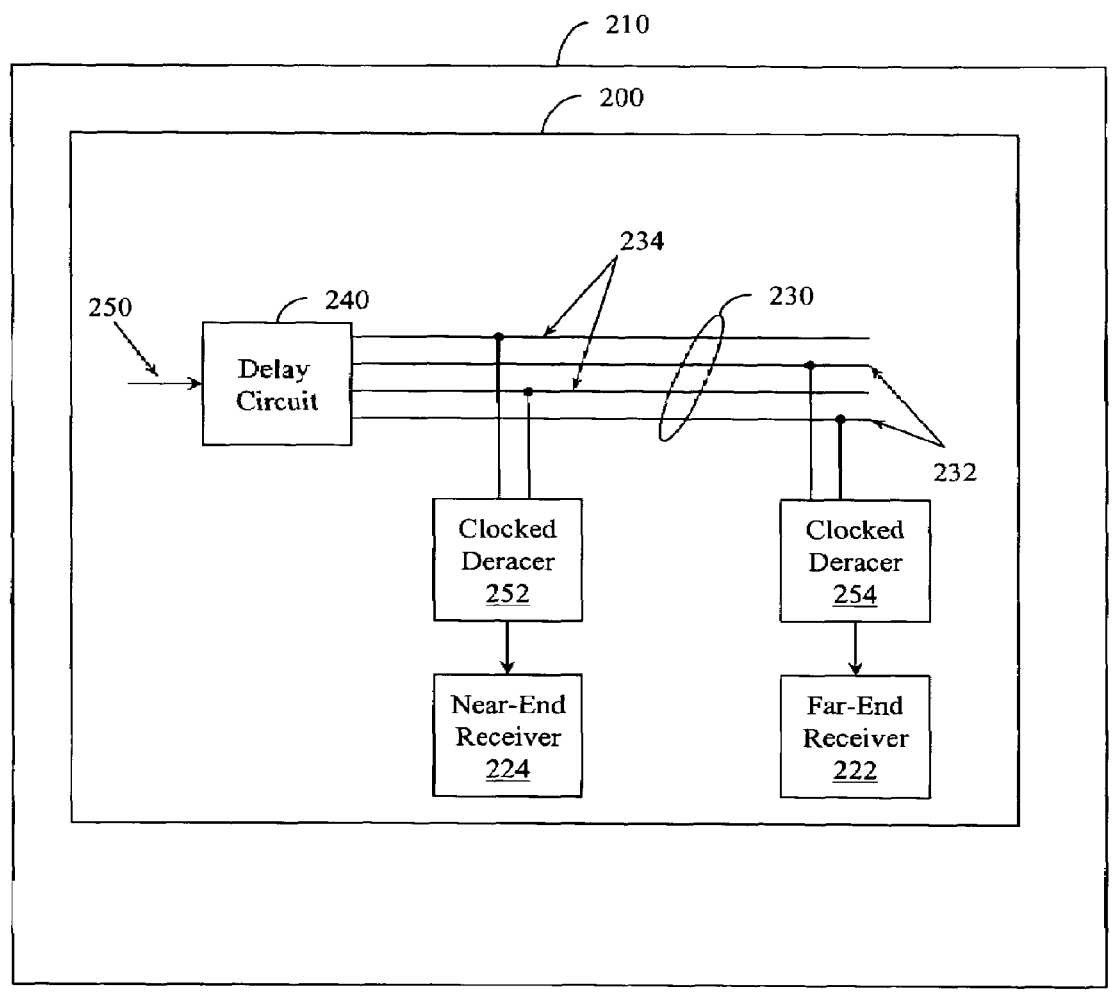
FIG. 2 illustrates an example VLSI integrated circuit configured with a circuit for processing time separated copies of a signal on interleaved interconnects.

FIG. 2 illustrates an example VLSI circuit 210 configured with a circuit 200 for processing time separated copies of a signal on interleaved interconnects. Circuit 200 facilitates selectively manipulating setup and hold timing at receivers distributed along a set of interconnects 230 in the VLSI integrated circuit 210.

Circuit 200 may include a delay circuit 240 that is configured to produce a delayed signal from an original signal 250 by selectively applying a timing delay to the original signal 250. As described above, the delay circuit 240 may be, for example, a set of inverters or other logic that introduces a delay into a copy of the signal 250. In FIG. 2, the delay circuit 240 is illustrated receiving the original signal 250 and providing time separated signals to the set 230 of interconnects. It is to be appreciated that in other examples, a copy of the original signal 250 may bypass the delay circuit 240 and be provided to the set 230 of interconnects as the fast copy of signal 250.

Circuit 200 may include a first plurality 232 of interconnects configured to supply the original signal 250 or a fast copy of signal 250 to a far-end receiver 222. While the original signal 250 is described, it is to be appreciated that the first plurality 232 of interconnects may provide a "fast" copy of the original signal 250, which may be the original signal 250 or a copy of the original signal 250 that has been manipulated by the delay circuit 240.

The circuit 200 may also include a second plurality 234 of interconnects that are operably connected to the delay circuit 240. The second plurality 234 of interconnects may be configured to supply the delayed signal to a near-end receiver 224. FIG. 2 illustrates the near-end receiver 224 being located closer, as measured by interconnect path length, to a source of the original signal 250 than the far-end receiver 222. Supplying the original signal 250 and/or a fast copy of the original signal 250 to the far-end receiver 222 facilitates removing a slack associated with a setup time on the far-end receiver 222. Similarly supplying the delayed or slow copy of the signal to the near-end receiver 224 facilitates removing a slack associated with a hold time on the near-end receiver 224.

Circuit 200 may also include a set of configurable clocked deracer circuits (e.g., 252, 254). The clocked deracer circuits may be configured to remove a slack associated with hold timing at both a near-end receiver 224 and a far-end receiver 222.

Since chip architectures may vary, in one example the delay circuit 240 may be configured to select a timing delay to apply to the original signal 250 based, at least in part, on a desired ratio between a reduction in a slack associated with a setup time on the far-end receiver 222 and a reduction in a slack associated with a hold time on the near-end receiver 224. Thus, circuit 200 may facilitate simultaneously addressing both setup time and hold time timing issues in near-end and far-end receivers. Additionally, in one example, to further address compounded setup time and hold time timing issues, a clocked deracer circuit(s) may be selectively configurable to remove the slack associated with hold timing at a receiver based, at least in part, on a relationship between a slack associated with a hold time on the far-end receiver 222 and a slack associated with a hold time on the near-end receiver 224.

Figure 3:
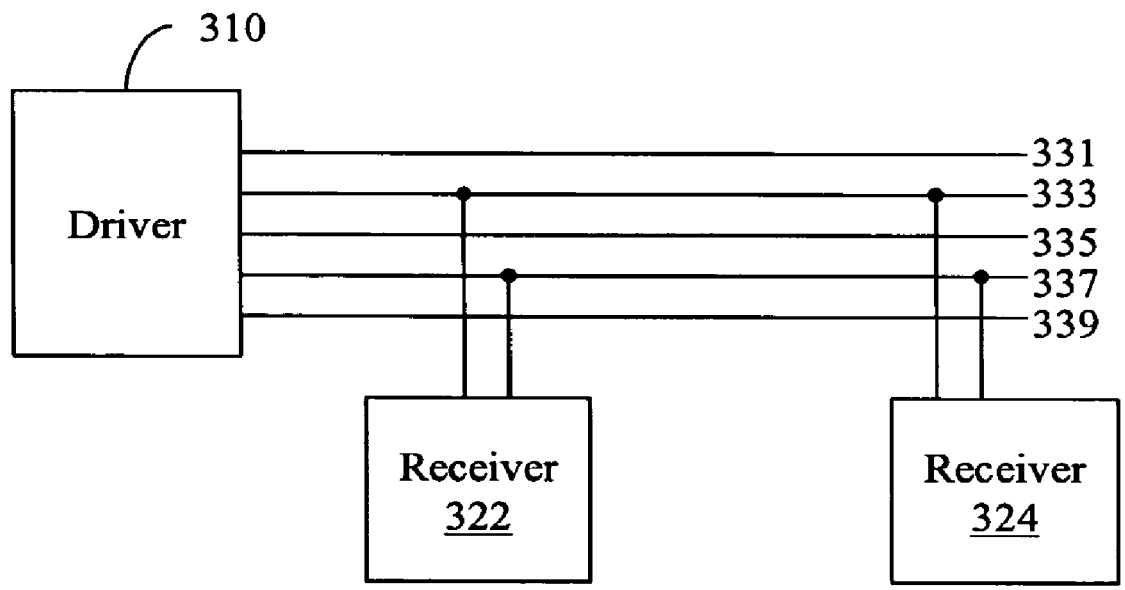
FIG. 3 illustrates conventional on-chip interconnects with distributed receivers.

As described above, chip architecture is precious. Thus, chip density and wire density continue to be ongoing design concerns. Prior Art FIG. 3 illustrates conventional on-chip interconnects with distributed receivers and illustrates how example systems and methods can facilitate mitigating compounded setup/hold time issues without increasing wire density. A conventional driver 310 may be configured to send a signal to a near-end receiver 322 and a far-end receiver 324. The driver 310 may employ interconnects 333 and 337 to send the signals to the near-end receiver 322 and the far-end receiver 324. To mitigate, for example, having signals induced on interconnects 333 and/or 337, experiencing crosstalk-induced delays on interconnects 333 and/or 337, and so on, interconnects 333 and 337 may be arranged between lines 331, 335, 339. Lines 331, 335, 339 and so on may be, for example, power lines that carry power signals (e.g., Vdd, ground) for no purpose other than shielding interconnects 333 and 337. While Prior Art FIG. 3 illustrates interconnects and power lines running parallel to each other in straight runs, it is to be appreciated that other conventional designs may also be replaced with example systems, circuits, and methods described herein. Therefore, it is to be appreciated that although FIG. 1 and FIG. 2 illustrate interleaved interconnects running in parallel in straight runs, other configurations of interconnects that provide slow and fast copies of signals may be employed.

Figure 4:
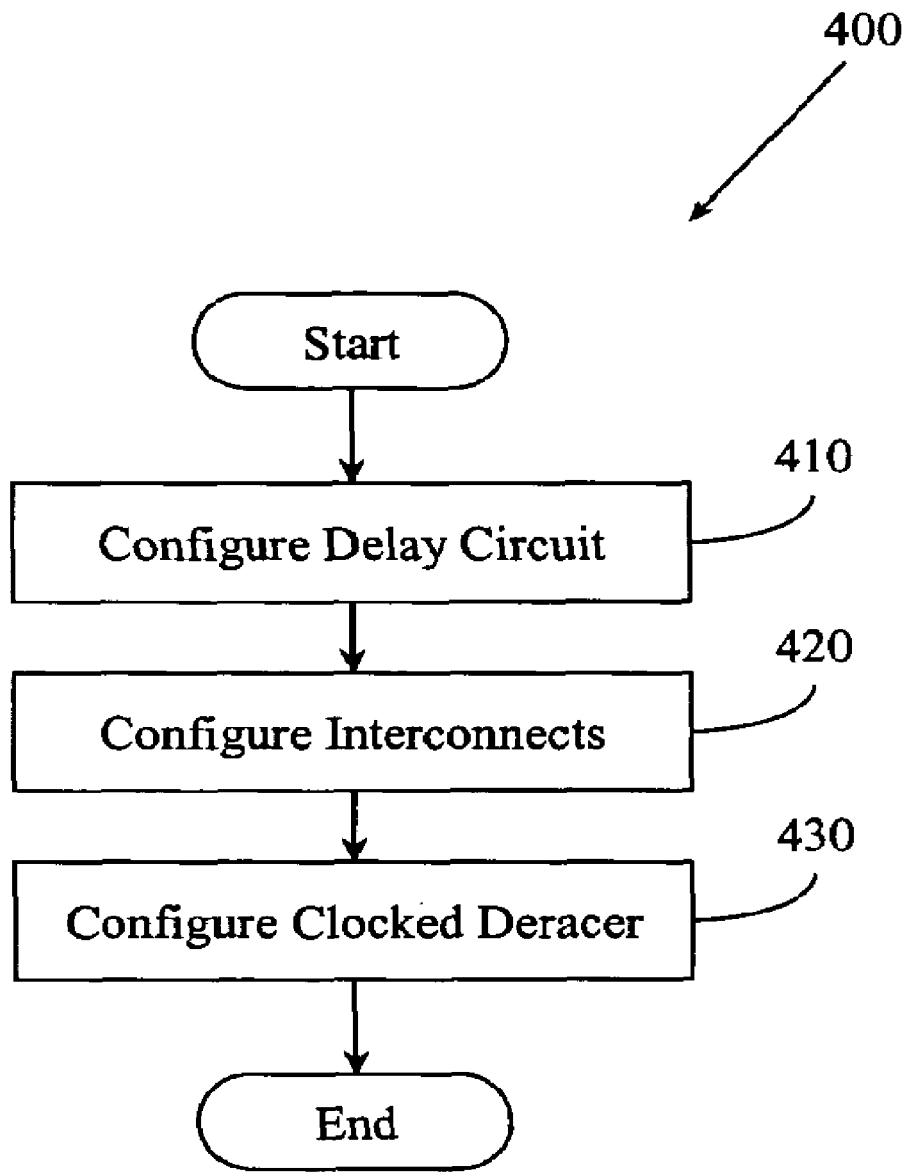
FIG. 4 illustrates an example method for arranging an integrated circuit with interleaved interconnects configured to carry time separated copies of a signal.
Figure 5:
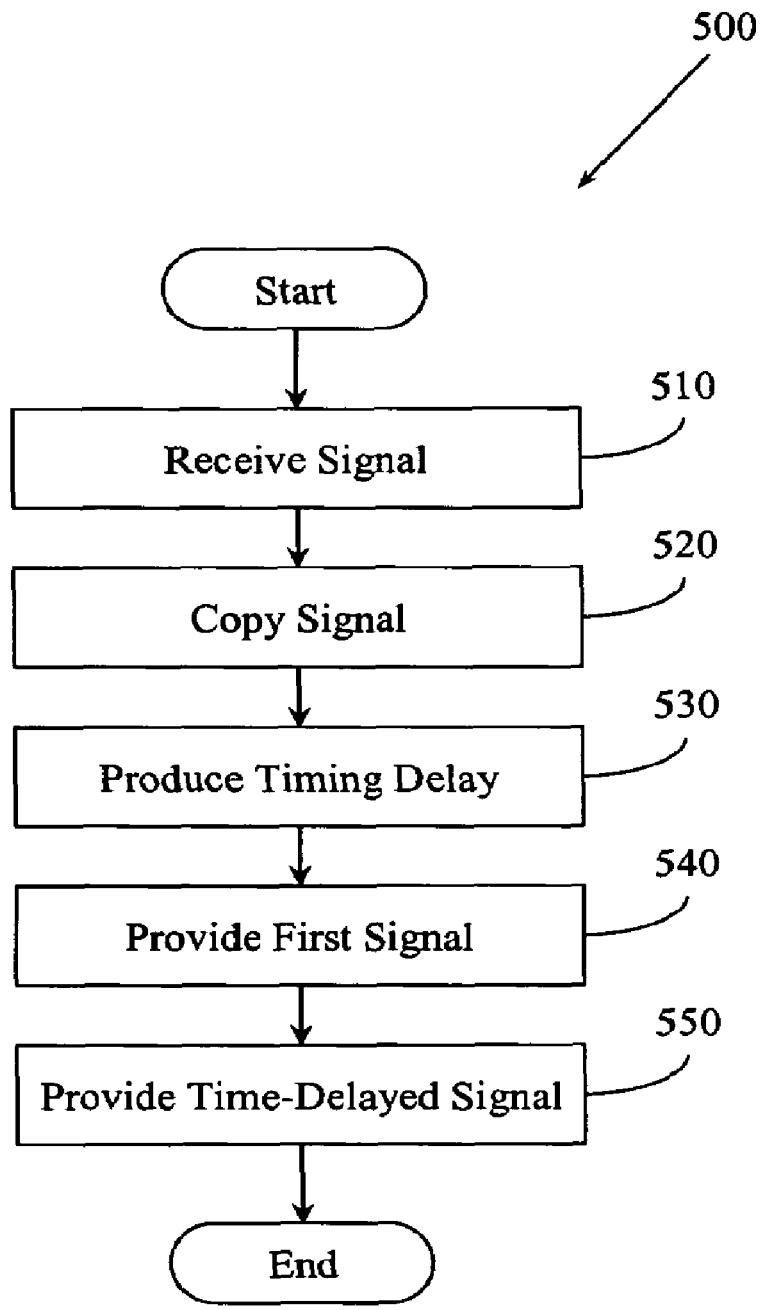
FIG. 5 illustrates an example method for processing signals in an integrated circuit to facilitate distributing time separated copies of a signal.

Example methods may be better appreciated with reference to the flow diagrams of FIGS. 4 and 5. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Furthermore, additional and/or alternative methodologies can employ additional, not illustrated blocks.

In the flow diagrams, blocks denote "processing blocks" that may be implemented with logic. The processing blocks may represent a method step and/or an apparatus element for performing the method step. A flow diagram does not depict syntax for any particular programming language, methodology, or style (e.g., procedural, object-oriented). Rather, a flow diagram illustrates functional information one skilled in the art may employ to develop logic to perform the illustrated processing. It will be appreciated that in some examples, program elements like temporary variables, routine loops, and so on, are not shown. It will be further appreciated that electronic and software applications may involve dynamic and flexible processes so that the illustrated blocks can be performed in other sequences that are different from those shown and/or that blocks may be combined or separated into multiple components. It will be appreciated that the processes may be implemented using various programming approaches like machine language, procedural, object oriented and/or artificial intelligence techniques.

FIG. 4 illustrates a method 400 for arranging an integrated circuit with interleaved interconnects configured to carry time separated copies of a signal. Thus, the method 400 facilitates mitigating setup time and hold time timing issues associated with delivering signals to distributed on-chip receivers via high-speed interconnects.

Method 400 may include, at 410, configuring the integrated circuit with a delay circuit configured to receive a signal. The delay circuit may also be configured to produce a duplicate copy of the signal, and to introduce a timing delay into the duplicate signal. In one example, the delay circuit may be formed from two or more logics like inverters. Configuring 410 the integrated circuit with the delay circuit may include, for example, designing the delay circuit into a new integrated circuit, re-designing an existing integrated circuit with the delay circuit, and so on.

Method 400 may also include, at 420, configuring the integrated circuit with a set of interconnects. Configuring 420 the integrated circuit with interconnects may include, for example, determining locations and routes for interconnects, determining inputs to the interconnects and outputs for the interconnects, determining interconnect types, widths, materials, and so on. Configuring 420 the integrated circuit with interconnects may also include operably connecting at least one member of the set of interconnects to the delay circuit.

The interconnects may be organized into subsets of interconnects to facilitate delivering different copies of a signal and also to facilitate shielding local and/or neighboring subsets of interconnects from undesired signals. Thus, configuring 420 the integrated circuit with interconnects may include configuring a first subset of the set of interconnects to carry a first "fast" signal to a first set of receivers. The first set of receivers may be, for example, a set of far-end receivers. The signal may be the original signal, a version of the signal with a first time delay that is different from the time delay introduced into the slow copy of the signal, and the like. The first subset of interconnects may be arranged on the integrated circuit as shields for the second subset of interconnects. For example, subsets of interconnects may run parallel to each other within a desired range with no other intervening interconnects. In one example, the first subset of interconnects are positioned on the integrated circuit as shields for the second subset of interconnects to prevent the second subset of interconnects from having an undesired signal induced thereon, from having a signal carried on the second subset of interconnects experience a crosstalk-induced delay, and the like.

Configuring 420 the integrated circuit with the set of interconnects may also include configuring a second subset of interconnects to carry the "slow" copy of the signal to a second set of receivers. In one example, configuring 420 the integrated circuit with interconnects may include arranging the second subset of interconnects on the integrated circuit as shields for the first subset of interconnects to prevent having an undesired signal induced on the first subset of interconnects, to prevent a signal being carried on the first subset of interconnects from experiencing a crosstalk-induced delay, and the like.

While two sets of interconnects are described in connection with FIG. 4, it is to be appreciated that in some examples an integrated circuit may be configured with two, three, or more sets of interconnects that carry, for example, fast, slow, and intermediate speed signals that may be arranged in mutually shielding patterns.

Method 400 may also include, at 430, configuring the integrated circuit with a set of clocked deracer circuits. The set of clocked deracer circuits may be configured to receive a signal (e.g., original signal, fast signal, slow signal) and to delay delivering that signal to a receiver. This may facilitate simultaneously mitigating hold time timing issues at both near-end and far-end receivers. Configuring 430 the integrated circuit with clocked deracers may include operably connecting the set of clocked deracer circuits to selected interconnects and selected receivers, which facilitates selectively delaying delivery of the fast and/or slow copy of the signal to, for example, a receiver.

FIG. 5 illustrates an example method 500 for processing signals in an integrated circuit to facilitate distributing time separated copies of a signal to distributed on-chip receivers via interconnects while simultaneously mitigating setup time and hold time timing issues. Method 500 may include, at 510, receiving a signal in an integrated circuit. The signal may be, for example, a data value to be distributed to a set of distributed receivers. Due to circuit complexity, interconnect length, setup time and hold time timing issues, desired slack, available slack, and so on, simply routing the signal through a set of interconnects may not provide a desired result.

Therefore, method 500 may include, at 520, creating a copy of the signal. The copy may be produced, for example, by providing the signal to a multiplexer. With the original signal and the copy of the signal available, method 500 may then include, at 530, producing a timing delay in the copy of the signal. The timing delay may be produced, for example, by passing the copy of the signal through logic (e.g., inverters) through which the original signal does not pass. The timing delay may be, for example, a two gate delay.

Method 500 may also include, at 540, providing the original signal to a first receiver via a first interconnect. Method 500 may also include, at 550, providing the time-delayed copy of the signal to a second receiver via a second interconnect. The first interconnect and the second interconnect may be arranged as mutual shields to facilitate shielding each other from undesired effects like an undesired signal being induced onto an interconnect, and a crosstalk-induced delay being induced onto an interconnect, and so on. For example, the first interconnect and the second interconnect may be arranged in an interleaved pattern. As used herein with respect to interconnects, interleaving refers to arranging interconnects in patterns like those illustrated in FIG. 6. In FIG. 6, an interconnect labeled F would carry a fast copy of a signal while an interconnect labeled S would carry a slow copy of a signal. While FIG. 6 illustrates various interleaved designs, it is to be appreciated that other patterns may be employed. Furthermore, while the examples illustrated in FIG. 6 show alternating fast/slow interconnects, it is to be appreciated that other patterns may be employed.

In one example, method 500 may also include (not illustrated), clock deracing the original signal and the time-separated copy of the signal before providing the signal or the copy to a receiver. In one example, clock deracing involves employing a clock pulse available to the receiver to block the signal or the time separated copy of the signal from being delivered to the receiver for a period of time.

While FIG. 5 illustrates various actions occurring in serial, it is to be appreciated that various actions illustrated in FIG. 5 could occur substantially in parallel. By way of illustration, a first process could receive a signal, a second process could copy the signal, a third process could produce a timing delay in the copy of the signal, a fourth process could provide the first signal to a first set of receivers, and a fifth process could provide the time separated copy of the signal to a second set of receivers. While five processes are described, it is to be appreciated that a greater and/or lesser number of processes could be employed and that lightweight processes, regular processes, threads, and other approaches could be employed. It is to be appreciated that other example methods may, in some cases, also include actions that occur substantially in parallel.

While example systems, methods, and so on, have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A system, comprising:
   a delay circuit configured to receive a first signal and to provide a time separated copy of the first signal;
   two or more sets of interconnects, a first set being configured to provide the first signal to a first receiver and a second set being configured to provide the time separated copy to a second receiver, at least one of the sets of interconnects being operably connected to the delay circuit, at least one of the sets of interconnects being arranged as a shield for another set of interconnects; and
   a clocked deracer circuit operably connected to at least one of the interconnects and being configured to delay delivery of a signal carried by at least one of the interconnects.

2. The system of claim 1, the first set of interconnects being arranged on an integrated circuit as a shield for the second set of interconnects to prevent an undesired signal from being induced on the second set of interconnects.

3. The system of claim 1, the second set of interconnects being arranged on an integrated circuit as a shield for the first set of interconnects to prevent an undesired signal from being induced on the first set of interconnects.

4. The system of claim 1, the first set of interconnects being arranged on an integrated circuit as a shield for the second set of interconnects to prevent a signal being carried on the second set of interconnects from experiencing a crosstalk-induced delay.

5. The system of claim 1, the second set of interconnects being arranged on an integrated circuit as a shield for the first set of interconnects to prevent a signal being carried on the first set of interconnects from experiencing a crosstalk-induced delay.

6. The system of claim 1, the first receiver and the second receiver comprising clock controlled circuit components.

7. The system of claim 1, the system being fabricated into a VLSI integrated circuit.

8. The system of claim 7, where at least one of the first signal and the time separated copy of the first signal are provided to a register file.

9. The system of claim 1, the first set of interconnects being configured to provide a far-end receiver with a far-end signal configured to remove a slack associated with a setup time on the far-end receiver.

10. The system of claim 9, the second set of interconnects being configured to provide a near-end receiver with a near-end signal configured to remove a slack associated with a hold time on the near-end receiver.

11. A system, comprising:
    a delay circuit configured to receive a first signal and to provide a time separated copy of the first signal;
    two or more sets of interconnects, a first set being configured to provide the first signal to a first receiver and a second set being configured to provide the time separated copy to a second receiver, at least one of the sets of interconnects being operably connected to the delay circuit, at least one of the sets of interconnects being arranged as a shield for another set of interconnects; and
    a clocked deracer circuit operably connected to at least one of the interconnects and being configured to delay delivery of a signal carried by at least one of the interconnects,
    the system being fabricated into a VLSI integrated circuit,
    the delay circuit being configured to select a timing delay to apply to the first signal to produce the near-end signal based, at least in part, on a desired ratio between a reduction in the slack associated with a setup time on the far-end receiver and a reduction in the slack associated with a hold time on the near-end receiver.

12. A system arranged on a VLSI circuit, comprising:
    a delay circuit configured to receive a first signal and to provide a time separated copy of the first signal, the delay circuit comprising a set of inverters;
    two sets of interleaved interconnects, a first set being configured to provide the first signal to a first receiver and a second set being configured to provide the time separated copy of the first signal to a second receiver;

the first set of interconnects and the second set of interconnects being arranged on an integrated circuit as shields for each other to prevent one or more of, an undesired signal being induced on either set of interconnects, and a crosstalk-induced delay being induced on a signal being carried by either set of interconnects; and a clocked deracer circuit operably connected to at least one member of the first set of interconnects or the second set of interconnects, the clocked deracer being configured to receive at least one of the first signal and the time separated copy of the first signal, and to employ a clock pulse to block at least one of the first signal and the time separated copy of the first signal from being delivered to a clock controlled circuit component for a period of time.

13. A method, comprising:

receiving a signal in an integrated circuit;

generating a duplicate signal from the signal;

producing a timing delay in the duplicate signal; and providing the signal to a first receiver via a first interconnect and providing the duplicate signal to a second receiver via a second interconnect, where the first interconnect and the second interconnect are arranged to facilitate shielding each other from one or more of, an undesired signal being induced onto the first interconnect or the second interconnect, and a crosstalk-induced delay being induced onto the first interconnect or the second interconnect.

14. The method of claim 13, where the timing delay comprises a two gate delay.

15. The method of claim 13, including clock deracing the signal before providing the signal to the first receiver and clock deracing the duplicate signal before providing the duplicate signal to the second receiver.

16. The method of claim 15, where clock deracing comprises employing a clock pulse to block a signal from being delivered for a period of time.

17. A method, comprising:

receiving a signal in an integrated circuit;

generating a duplicate signal from the signal;

producing a two gate timing delay in the duplicate signal;

providing the signal to a first receiver via a first interconnect and providing the duplicate signal to a second receiver via a second interconnect, where the first interconnect and the second interconnect are arranged to facilitate shielding each other from one or more of, an undesired signal being induced onto the first interconnect or the second interconnect, and a crosstalk-induced delay being induced onto the first interconnect or the second interconnect; and clock deracing the signal before providing the signal to the first receiver and clock deracing the duplicate signal before providing the duplicate signal to the second receiver, where clock deracing comprises employing a clock pulse to block the signal and the duplicate signal from being delivered for a period of time.

18. A system, comprising:

means for imposing a timing delay on a copy of a signal in an integrated circuit; and means for partitioning and selectively delivering a signal and the copy of the signal to a set of clocked deracers in the integrated circuit, where the means for delivering the signal and the copy of the signal shield each other from one or more of, undesired induced signals, and crosstalk-induced delays.

19. A circuit configured to selectively manipulate setup timing and hold timing at receivers distributed along a set of interconnects in a VLSI integrated circuit, comprising:

a delay circuit configured to produce a delayed signal from an original signal by selectively applying a timing delay to the original signal in the VLSI integrated circuit;

a first plurality of interconnects configured to supply the original signal to a far-end receiver;

a second plurality of interconnects operably connected to the delay circuit, the second plurality of interconnects being configured to supply the delayed signal to a near-end receiver, the near-end receiver being located closer, as measured by interconnect path length, to a source of the original signal than the far-end receiver; and a configurable clocked deracer circuit configured to reduce a slack associated with hold timing at the near-end receiver and the far-end receiver.

20. The circuit of claim 19, where supplying the original signal to the far-end receiver reduces a slack associated with a setup time on the far-end receiver to a desired range.

21. The circuit of claim 19, where supplying the delayed signal to the near-end receiver reduces a slack associated with a hold time on the near-end receiver to a desired range.

22. The circuit of claim 19, the configurable clocked deracer circuit being selectively configurable to remove the slack associated with hold timing at the near-end receiver and the far-end receiver based, at least in part, on a relationship between a slack associated with a hold time on the far-end receiver and a slack associated with a hold time on the near-end receiver.

23. The circuit of claim 19, the first plurality of interconnects being positioned as a shield for the second set of interconnects.

24. The circuit of claim 19, the second plurality of interconnects being positioned as a shield for the first set of interconnects.

25. A circuit configured to selectively manipulate setup timing and hold timing at receivers distributed along a set of interconnects in a VLSI integrated circuit, comprising:

a delay circuit configured to produce a delayed signal from an original signal by selectively applying a timing delay to the original signal in the VLSI integrated circuit;

a first plurality of interconnects configured to supply the original signal to a far-end receiver;

a second plurality of interconnects operably connected to the delay circuit, the second plurality of interconnects being configured to supply the delayed signal to a near-end receiver, the near-end receiver being located closer, as measured by interconnect path length, to a source of the original signal than the far-end receiver; and a configurable clocked deracer circuit configured to reduce a slack associated with hold timing at the near-end receiver and the far-end receiver, where supplying the delayed signal to the near-end receiver reduces a slack associated with a hold time on the near-end receiver to a desired range, the delay circuit being configured to select a timing delay to apply to the original signal based, at least in part, on a desired ratio between a reduction in a slack associated with a setup time on the far-end receiver and a reduction in a slack associated with a hold time on the near-end receiver.

\* \* \* \* \*